United States Patent
Cimino et al.

(10) Patent No.: US 10,529,704 B1
(45) Date of Patent: Jan. 7, 2020

(54) AUXILIARY GATE ANTENNA DIODES

(71) Applicant: GLOBALFOUNDRIES Inc., Grand Cayman (KY)

(72) Inventors: Salvatore Cimino, Waterford, NY (US); David Pritchard, Glenville, NY (US); Lixia Lei, Clifton Park, NY (US); Heng Yang, Rexford, NY (US); Manjunatha Prabhu, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/148,323

(22) Filed: Oct. 1, 2018

(51) Int. Cl.
*H01L 27/02* (2006.01)
*H01L 29/78* (2006.01)
*H01L 29/06* (2006.01)

(52) U.S. Cl.
CPC ...... *H01L 27/0255* (2013.01); *H01L 29/0649* (2013.01); *H01L 29/785* (2013.01)

(58) Field of Classification Search
CPC ............. H01L 27/0255; H01L 29/0649; H01L 29/785
See application file for complete search history.

(56) References Cited

U.S. PATENT DOCUMENTS

| | | | | |
|---|---|---|---|---|
| 2001/0038126 A1* | 11/2001 | Liou | ................... | H01L 27/0255 257/355 |
| 2005/0012155 A1* | 1/2005 | Ker | ................... | H01L 27/0266 257/355 |
| 2007/0194380 A1* | 8/2007 | Okushima | ........... | H01L 27/0255 257/355 |
| 2007/0267700 A1* | 11/2007 | Russ | ................... | H01L 27/0255 257/355 |
| 2007/0278542 A1* | 12/2007 | Yuki | ................... | H01L 27/0255 257/288 |
| 2011/0212595 A1* | 9/2011 | Hu | ........................ | H01L 21/761 438/430 |
| 2012/0256292 A1* | 10/2012 | Yu | ....................... | H01L 27/0255 257/510 |
| 2013/0001696 A1* | 1/2013 | Akiyama | ............ | H01L 21/8252 257/355 |
| 2013/0161733 A1* | 6/2013 | Hayano | ............... | H01L 27/0629 257/329 |
| 2014/0001561 A1* | 1/2014 | Cheng | ............. | H01L 21/823807 257/369 |
| 2014/0159157 A1 | 6/2014 | Jensen et al. | | |

(Continued)

*Primary Examiner* — Nathan W Ha
(74) *Attorney, Agent, or Firm* — Amerson Law Firm, PLLC

(57) ABSTRACT

One illustrative embodiment disclosed herein relates to a semiconductor device that includes, among other things, a semiconductor substrate including a base semiconductor layer, an active semiconductor layer, and a buried insulating layer positioned between the base semiconductor layer and the active semiconductor layer. The device further includes a set of functional gate structures including at least one functional gate structure formed above the active semiconductor layer, a first source/drain region positioned in the active semiconductor layer adjacent a first functional gate structure in the set, a first auxiliary gate structure positioned adjacent the first source/drain region, and a discharge device coupled to the base semiconductor layer and the first auxiliary gate structure.

20 Claims, 3 Drawing Sheets

(56) References Cited

U.S. PATENT DOCUMENTS

| | | | |
|---|---|---|---|
| 2014/0210003 A1* | 7/2014 | Ko | H01L 27/0629 257/337 |
| 2014/0284760 A1* | 9/2014 | Cheng | H01L 21/84 257/528 |
| 2015/0041883 A1* | 2/2015 | Kimura | H01L 29/66659 257/328 |
| 2015/0214212 A1* | 7/2015 | Hellings | H01L 27/0255 257/356 |
| 2016/0056145 A1* | 2/2016 | Nagumo | H01L 29/66462 257/76 |
| 2017/0005081 A1* | 1/2017 | Laine | H01L 27/0255 |
| 2017/0062406 A1* | 3/2017 | Ko | H01L 29/7436 |
| 2017/0179240 A1* | 6/2017 | Radens | H01L 29/41775 |
| 2018/0286853 A1* | 10/2018 | Mallikarjunaswamy | H01L 27/0255 |
| 2019/0181264 A1* | 6/2019 | Cheng | H01L 29/7838 |

* cited by examiner

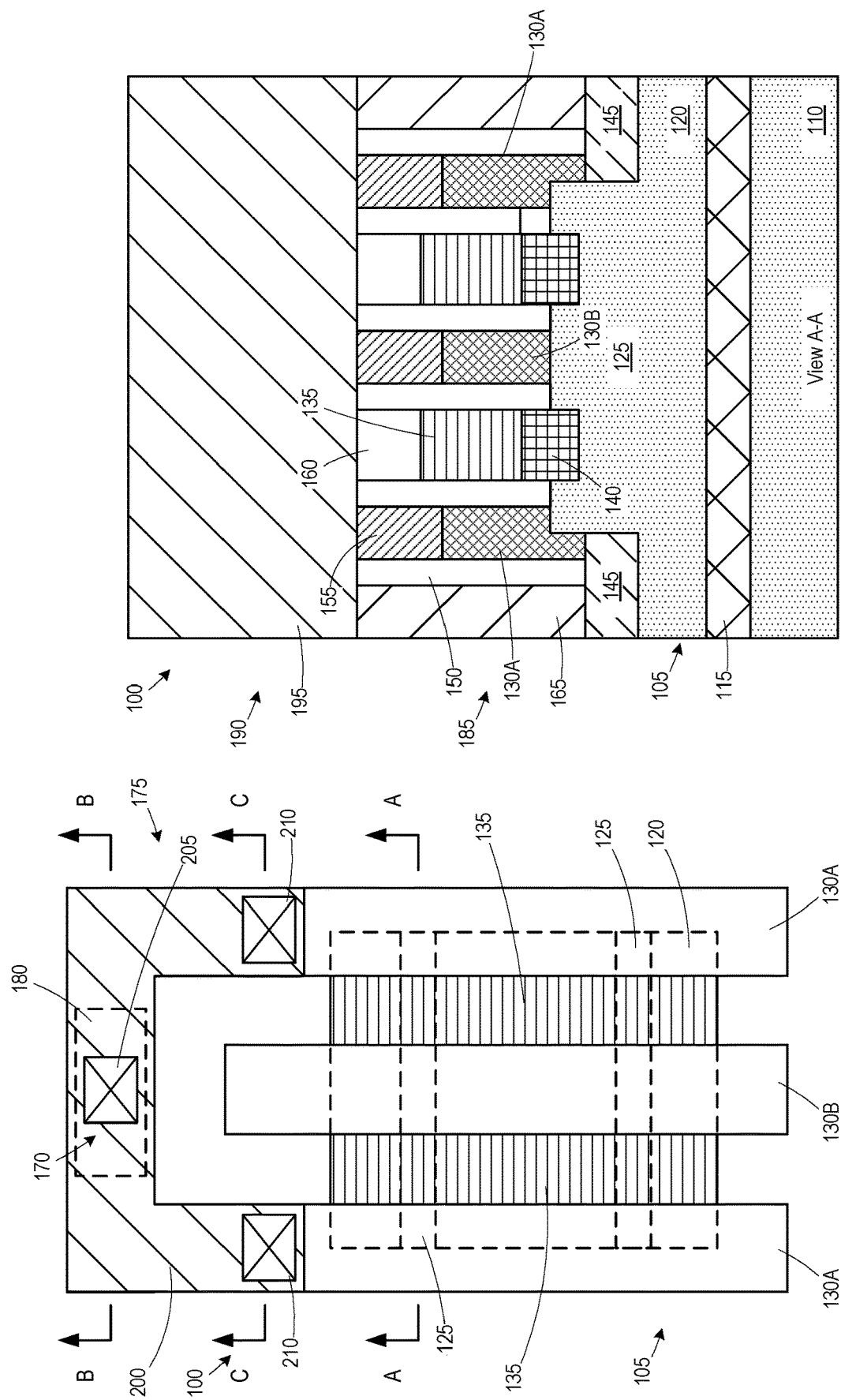

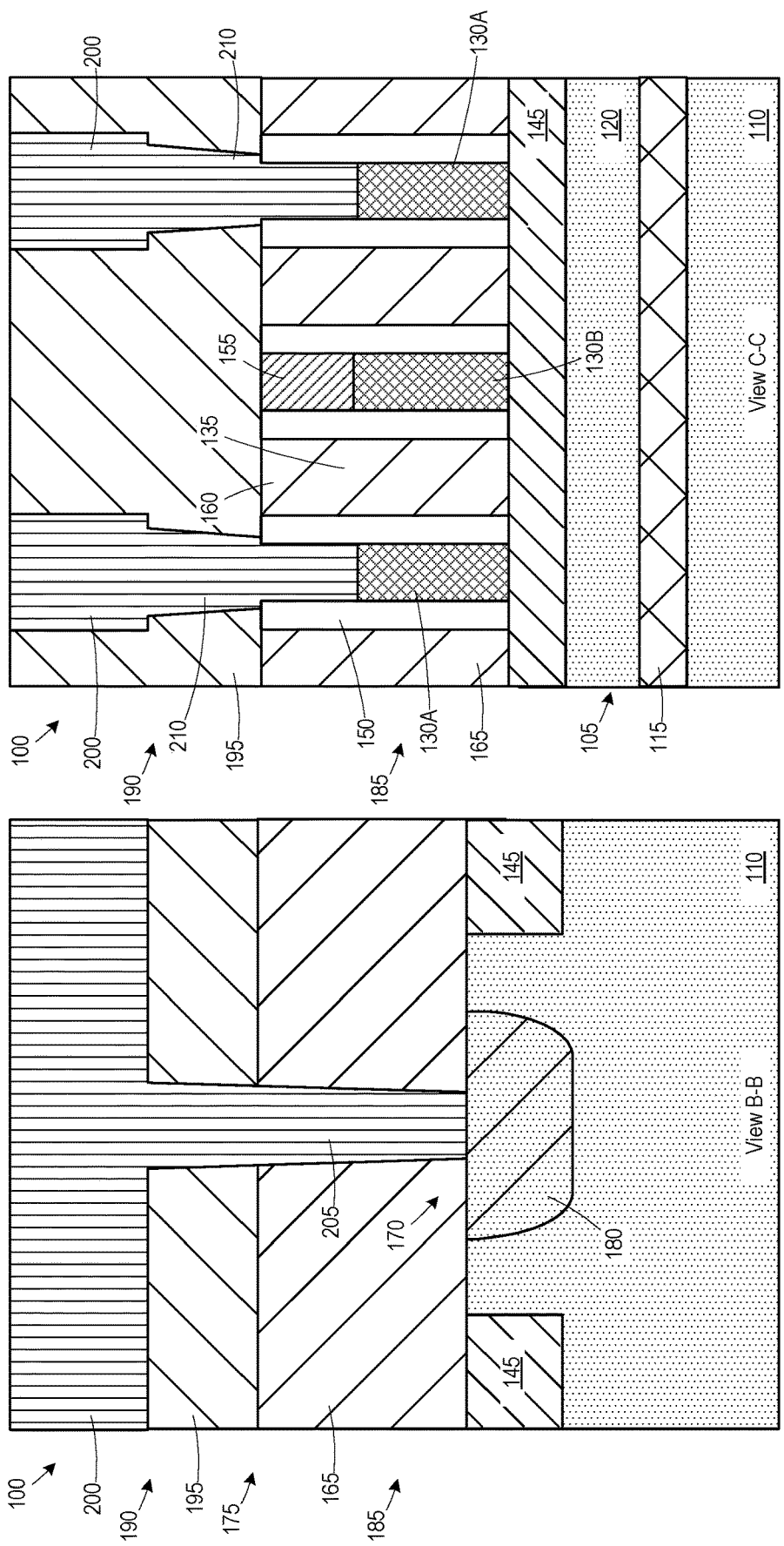

AUXILIARY GATE ANTENNA DIODES

BACKGROUND

Field of the Disclosure

Generally, the present disclosure relates to semiconductor devices and, in particular, to techniques for forming auxiliary gate antenna diodes to control plasma antenna effects during plasma treatments performed during the manufacturing of semiconductor devices.

Description of the Related Art

In manufacturing semiconductor products, such as integrated circuits, individual components, such as transistors, diodes and the like, may typically involve a plurality of process steps performed on the basis of an appropriate carrier or substrate material. The substrate material, frequently provided in the form of an appropriate semiconductor material, such as silicon and the like, is processed by patterning specific device-related structures, which typically involves the deposition of one or more appropriate material layers, providing a respective mask layer so as to define the lateral size and shape of the respective features, followed by a patterning process, such as an etch process, in order to remove unwanted material portions of the previously deposited one or more material layers. In this manner, layer-for-layer, further components of a specific circuit element may be formed, wherein precise alignment to the previously patterned layers is required.

Plasma-assisted process techniques allow etch processes to be performed on the basis of a highly directional behavior. In a plasma technique, certain species in the plasma ambient may be ionized and appropriately accelerated to the substrate material to be treated, thereby obtaining a high degree of directionality of the respective accelerated particles. The chemical effect of a plurality of etch species can be provided with a well-defined directionality, thereby providing "anisotropic" etch characteristics for plasma-assisted removal processes without regard for the crystallographic orientation of the materials. Moreover, plasma-assisted processes have also been introduced into other concepts, such as deposition processes, in which the reactive behavior of certain components can be increased without requiring specific high temperatures, which would otherwise be necessary for initiating a desired chemical reaction. In still other cases, plasma treatments for incorporating certain species, adjusting surface characteristics of specific material layers and the like, are also frequently applied in sophisticated manufacturing strategies for forming semiconductor devices.

When using a plasma ambient for treating a semiconductor substrate, however, certain side effects are involved, since, depending on the materials exposed to the plasma ambient, the more or less continuous "bombardment" of charged particles may affect exposed surface areas or even underlying material components. That is, a certain surface area may act as an "antenna" on which charge may accumulate due to the continuous "bombardment" of charged particles of the plasma ambient. Therefore, the respective charge may have to be discharged in order to prevent undue voltages from building up within the substrate to be treated. For example, when patterning a gate electrode structure for a field effect transistor, a relatively thin gate dielectric material, which may have a thickness of several nanometers and even less in sophisticated devices, may have to be formed in combination with appropriate electrode materials, such as polysilicon and the like. Since a corresponding patterning process requires precise transfer of the mask dimensions into the underlying material layers, respective plasma-assisted etch recipes have to be applied, thereby also contributing to respective adverse side effects of the plasma ambient. During certain phases of the overall patterning process, charge may accumulate in the respective antenna, i.e., for instance, the gate electrode material, and may possibly lead to voltages that may exceed the breakdown voltage of the sensitive gate dielectric materials. Therefore, respective discharge paths may have to be provided for the charge during a plasma treatment in order to reliably restrict the accumulation of charges to a non-critical level. For example, the substrate material may be connected to a corresponding electrode assembly of the plasma process tool in order to discharge unwanted charges, which, in turn, may be discharged from respective critical surface areas into the substrate material. With the introduction of ever-decreasing feature sizes and more complex structures and, in particular, the incorporation of device architectures resulting in substantially vertically isolated device areas, such as semiconductor- or silicon-on-insulator (SOI) configurations, it becomes increasingly difficult to provide appropriate discharge paths for maintaining parasitic voltages at a non-critical level during plasma treatments.

For these reasons, circuit designers have been forced to intentionally add respective discharge structures, such as substrate diodes in combination with appropriate conductive paths, which may connect to critical device features, such as gate electrode structures, drain and source regions and, in particular, to SOI transistors, and the like, so as to provide efficient discharge mechanisms during one or more plasma treatments. Consequently, significant efforts have been made in order to appropriately implement corresponding diode structures, also typically referred to as antenna diodes, into the overall design and to provide appropriate conductive paths that are available during the various stages of the overall manufacturing processes in order to avoid or at least significantly reduce the probability of plasma-induced damage of sensitive device areas.

Although such protective structures have been successfully implemented in modern circuits designs, it appears, nevertheless, that such additional protective structures, which may not have any function during the actual operation of a corresponding semiconductor device, may negatively affect the operational behavior, since such protective structures, such as antenna diodes and the like, are typically associated with additional capacitance and also contribute to increased leakage currents, which may, therefore, have to be taken into consideration when designing and evaluating performance of any such complex semiconductor devices. In particular, in sophisticated fully depleted SOI semiconductor devices, it appears that superior protection of source and drain regions, as well as the gate electrode, may be required, since the source and drain regions, in particular, may no longer act as a direct diode to the substrate due to the SOI architecture. The added parasitic capacitance and leakage contribute to reduced device performance, and increasingly complicated design may also be necessary for bipolar operation in such sophisticated SOI devices, thereby contributing to increased manufacturing costs and reduced performance.

The present disclosure is directed to various methods and resulting devices that may avoid, or at least reduce, the effects of one or more of the problems identified above.

SUMMARY

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure contemplates devices, manufacturing techniques and strategies for addressing the problem of reduced device performance due to parasitic capacitance, leakage currents and the like, associated with the provision of respective protective diode structures and respective conductive paths required for restricting or avoiding plasma-induced damage in sensitive device areas, such as source and drain regions and gate electrode structures of sophisticated transistor elements.

One illustrative embodiment disclosed herein relates to a semiconductor device. The semiconductor device includes, among other things, a semiconductor substrate including a base semiconductor layer, an active semiconductor layer, and a buried insulating layer positioned between the base semiconductor layer and the active semiconductor layer. The device further includes a set of functional gate structures including at least one functional gate structure formed above the active semiconductor layer, a first source/drain region positioned in the active semiconductor layer adjacent a first functional gate structure in the set, a first auxiliary gate structure positioned adjacent the first source/drain region, and a discharge device coupled to the base semiconductor layer and the first auxiliary gate structure.

Another illustrative semiconductor device includes, among other things, a semiconductor substrate including a base semiconductor layer, an active semiconductor layer, and a buried insulating layer positioned between the base semiconductor layer and the active semiconductor layer. The device further includes a plurality of functional gate structures formed above the active semiconductor layer, a first source/drain region positioned adjacent a first functional gate structure in a first subset of the plurality of functional gate structures, a second source/drain region positioned adjacent a first functional gate structure in a second subset of the plurality of functional gate structures, a first auxiliary gate structure positioned between the first and second source/drain regions, and a discharge device coupled to the base semiconductor layer and the first auxiliary gate structure.

BRIEF DESCRIPTION OF THE DRAWINGS

The disclosure may be understood by reference to the following description taken in conjunction with the accompanying drawings, in which like reference numerals identify like elements, and in which:

FIG. 1 schematically illustrates a simplified plan view of a semiconductor product including auxiliary gate strictures connected to a protective discharge structure;

FIG. 2 is a cross-section view of the product of FIG. 1 taken along a long axis of a fin in a gate length direction;

FIG. 3 is a cross-section view of the product of FIG. 1 taken in the gate length direction through a discharge structure;

FIG. 4 is a cross-section view of the product of FIG. 1 taken in the gate length direction through the gate structures outside the active region.

Figure 5:
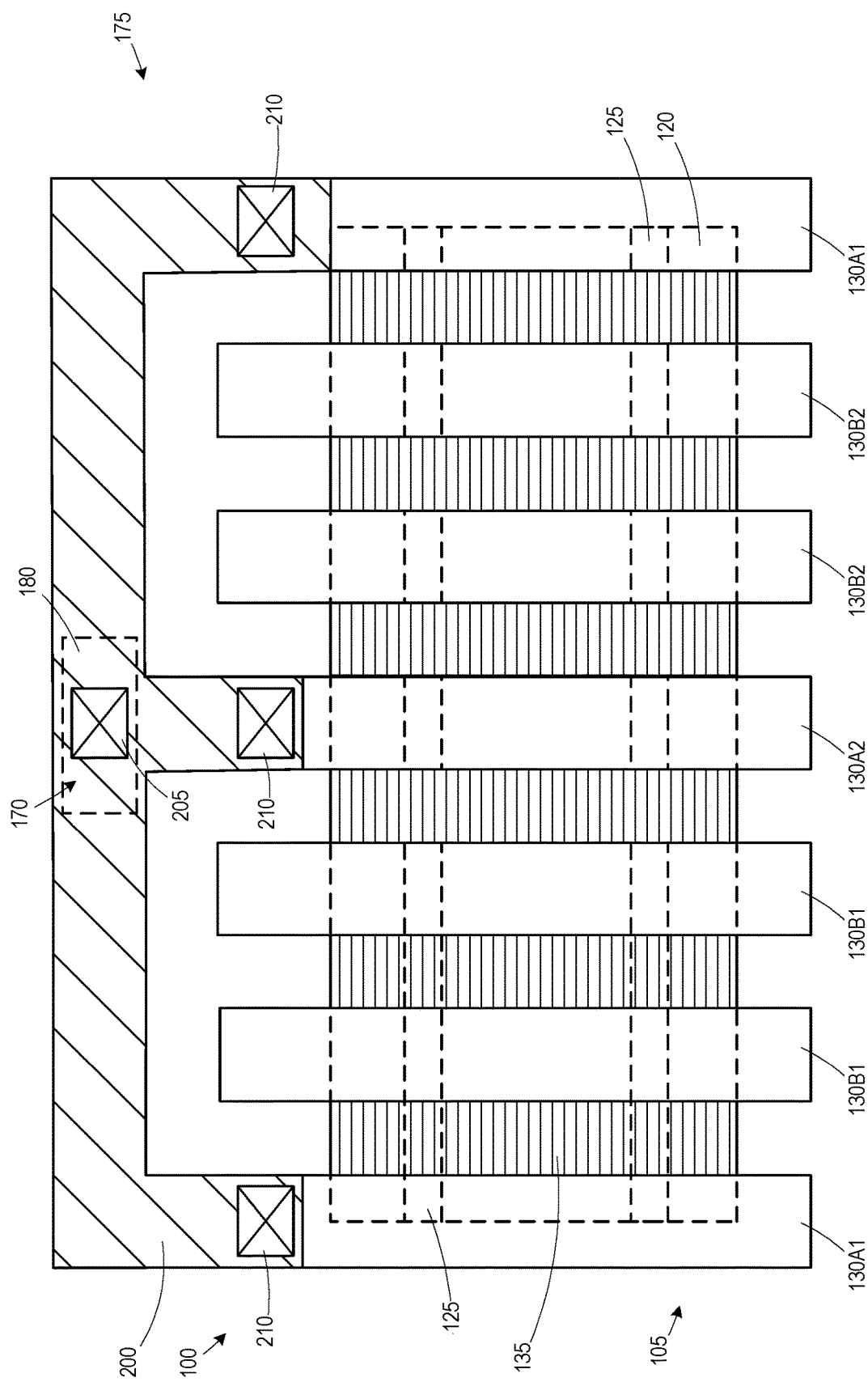
FIG. 5 is a simplified plan view of an alternative embodiment of the semiconductor product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

FIGS. 1-5 depict various novel methods disclosed herein for forming auxiliary gate antenna diodes for transistor devices on an integrated circuit (IC) product 100 and the resulting novel structures. FIG. 1 is a simplistic plan view of the product 100 with various layers of insulating material removed, FIG. 2 is a cross-section view of the product 100 along line A-A, FIG. 3 is a cross-section view of the product 100 along line B-B, and FIG. 4 is a cross-section view of the product 100 along line C-C. In the depicted example, the IC product 100 is formed on a silicon-on-insulator (SOI) structure 105 including a bulk semiconductor layer 110, a buried insulation layer 115 (e.g., silicon dioxide), and an active semiconductor layer 120. The bulk semiconductor layer 110 may be made of silicon or it may be made of materials other than silicon. Additionally, various doped regions, e.g., halo implant regions, well regions and the like, are not depicted in the attached drawings.

A plurality of fins 125 are defined in the active semiconductor layer 120. Gate structures 130A, 130B are positioned above the fins 125. Source/drain contact structures 135 (e.g., trench silicide (TS) structures) are conductively coupled to source/drain regions 140 of the product 100. A lower portion of the fin 125 and a surface of the active semiconductor layer 120 is covered by an isolation structure 145. Sidewall spacers 150 (e.g., silicon nitride) are positioned on sidewalls of the gate structures 130A, 130B, and dielectric cap layers 155 are positioned above the gate structures 130A, 130B. Dielectric cap layers 160 are also positioned above the source/drain contact structures 135. The view A-A should be understood to be a cross-sectional view taken through the long axis of a fin 125 in a direction that corresponds to the gate length (current transport) direction of a FinFET device. A first dielectric layer 165 (e.g., silicon dioxide, a low-k dielectric material, or an ultra-low-k dielectric material) is formed between the gate structures 130A, 130B.

The gate structures 130A are auxiliary, or "dummy" gate structures, and the gate structure 130B is a functional gate structure. Auxiliary gate structures 130A are provided to provide a uniform pitch for an array of gate structures including the functional gate structure 130B. The number of functional gate structures 130B positioned between the auxiliary gate structures 103A may vary. Note that the auxiliary gate structures 103A overlap edges of the fin 125 (i.e., the active region) and the isolation structure 145.

In the illustrative example depicted herein, the transistor devices are FinFET devices, but the embodiments disclosed herein should not be considered to be limited to IC products that include FinFET transistor devices as the various inventions disclosed herein may be employed when manufacturing other forms of transistors, such as planar transistor devices. At the point of processing depicted in FIG. 1, the fins 125 were formed in the active semiconductor layer 120 using traditional manufacturing techniques, and the gate structures 130A, 130B were formed across the fins 125. The fins 125 were formed by performing one or more etching processes, e.g., anisotropic etching processes, through a patterned fin-formation etch mask (not shown) to form a plurality of fin-formation trenches in the active semiconductor layer 120. The width and height of the fins 125 may vary depending upon the particular application. Additionally, the overall size, shape and configuration of the fin-formation trenches and fins 125 may vary depending on the particular application. Next, a layer of insulating material 145 (e.g., silicon dioxide) was then deposited so as to overfill the fin-formation trenches. A chemical mechanical polishing (CMP) process was then performed to planarize the upper surface of the layer of insulating material 145 with the upper surface of fins 125, thereby removing the patterned fin-formation hard mask. Next, a recess etching process was performed on the layer of insulating material 145 such that it has a recessed upper surface that exposes a desired amount of the fins 125 above the recessed upper surface.

After the layer of insulating material 145 was recessed, the gate structures 130A, 130B were formed above the fins 125. The sidewall spacers 150 and the cap layers 155, 160 may include a variety of different materials, such as silicon nitride, SiNC, SiN, SiCO, SiNOC, etc. In one illustrative embodiment, the sidewall spacer 150 and the cap layer 155 may be made of the same material, e.g., silicon nitride. Typically, the gate structures 130A, 130B are manufactured using known replacement gate manufacturing techniques, where a sacrificial gate structure (not shown) is formed above the active semiconductor layer 120, along with an original cap layer (not shown) positioned above the sacrificial gate structure and used as a hard mask for forming the sacrificial gate structure. Next, prior to the formation of the final gate structures 130A, 130B, epitaxially-grown (epi) semiconductor material 140 was formed on the exposed portions of the active regions (e.g., fins 125 in the case of a FinFET device), i.e., in the source/drain regions of the devices. The semiconductor material 140 may be formed to any desired thickness. However, it should be understood that the semiconductor material 140 need not be formed in all applications. Other layers of material, such as contact etch stop layers and the like, are not depicted in the drawings. The source/drain contact structures 135 were formed in cavities between the gate structures 130A, 130B and the sidewall spacers 150. The fin 125, the gate structure 130B, and the source/drain regions 140 are elements of a transistor device.

After formation of the semiconductor material 140, a layer of insulating material 165 was blanket-deposited across the product 100. Thereafter a CMP process was performed to planarize the layer of insulating material 165 using the original gate caps (not shown) positioned above the sacrificial gate structures as a polish stop layer. At that point, an etching process was performed so as to remove the original gate caps so as to expose the upper surface of the sacrificial gate structure for removal. Then, traditional replacement gate manufacturing processes were performed to remove the sacrificial gate structures so as to define replacement gate cavities between the spacers 150 where the final gate structures 130A, 130B are formed by sequentially depositing various layers of material, such as a gate insulation layer (e.g., silicon dioxide, hafnium dioxide, or some other high-k material), a barrier layer, a work function material layer, and a conductive fill layer)—not separately shown) into the replacement gate cavities and performing a planarization process to remove the portions of the gate materials positioned outside of the gate cavities. Thereafter, the materials for the gate structures 130A, 130B were recessed so as to make room for the cap layer 155. Then, the cap layers 155 were formed by depositing a layer of dielectric material in the space above the recessed gate materials and then performing a planarization process. Next, portions of the dielectric layer 165 above the source/drain regions were removed and the above-referenced source/drain contact structures 135 were formed in the source/drain regions of the devices. Then, a recess etching process was performed on the source/drain contact structures 135 to make room for an insulating cap layer 160 to be formed above each of the source/drain contact structures 135. The insulating cap layer 160 may be formed by depositing a layer of insulating material, e.g., silicon dioxide, SiC, SiCO, etc., above the recessed source/drain contact structures 135 and then performing a planarization process.

As seen in FIG. 3, the product 100 includes a discharge structure 170 that interfaces with the bulk semiconductor layer 110 in a hybrid region 175 of the product where at least a portion of the buried insulating layer 115 is absent (e.g., removed), thereby exposing the bulk semiconductor layer 110. In some embodiments, the discharge structure 170 is a diode including a doped region 180 formed in the bulk semiconductor layer 110. The doped region 180 may be doped with the opposite type dopant (e.g., N+) as the bulk semiconductor layer 110 (e.g., P−). Additional doped wells, such as a P-well (not shown), may be formed in the bulk semiconductor layer 110 below the doped region 180. In some embodiments, the discharge structure 170 may be a substrate contact directly connected to the bulk semiconductor layer 110 (e.g., no diode). In such an embodiment, the doped region 180 may be doped with the same type dopant (e.g., P+) as the bulk semiconductor layer 110 (e.g., P−). In some embodiments, a metal silicide layer may be formed in at least a portion of the doped region 180.

As seen in FIGS. 3 and 4. after forming the transistor devices on a device layer 185 of the product 100, one or more metallization layers 190 were formed. A second dielectric layer 195 (e.g., silicon dioxide, a low-k dielectric material, or an ultra-low-k dielectric material) was formed above the first dielectric layer 165. A conductive line 200 (e.g., metal) was formed by etching trenches in the second dielectric layer 195. Via openings were also formed in the second dielectric layer 195 to expose the auxiliary gate structures 130A and to expose the doped region 180. Portions of the cap layers 155 exposed by the via openings were also removed. A conductive via 205 connects the conductive line 200 to the doped region 180. Conductive vias 210 connect the conductive line 200 to the auxiliary gate structures 130A.

FIG. 5 is a plan view of an alternative embodiment of the product 100 including edge auxiliary gate structures 130A1, and at least one intermediate edge auxiliary gate structure 130A2 disposed on an interior portion of the active semiconductor layer 120 that defines the active region. Functional gate structures 130B1, 130B2 are positioned between the auxiliary gate structures 130A1, 130A2. The fin 125, the gate structures 130B1, 130B2, and the source/drain regions 140 (not shown in FIG. 5) are elements of transistor devices. In some embodiments, the transistor devices associated with the functional gate structures 130B1, 130B2 may have similar characteristics. In other embodiments, the transistor devices associated with functional gate structures 130B1 may have a first operating characteristic (e.g., threshold voltage, conductivity type, etc.), and the transistor devices associated with functional gate structures 130B2 may have a second, different operating characteristic (e.g., different threshold voltage. conductivity type, etc.). The conductive via 205 connects the conductive line 200 to the doped region 180. Conductive vias 210 connect the conductive line 200 to the auxiliary gate structures 130A1, 130A2.

The discharge structure 170 (e.g., diode or direct connection) is connected to the auxiliary gate structures 130A, 130A1, 130A2 to serve as a protection device to discharge charge generated during subsequent plasma treatments. Leakage current between the source/drain regions 140 and the auxiliary gate structures 130A, 130A1, 130A2 discharges the source/drain regions 140. This arrangement reduces the overall leakage associated with the product 100 as compared to providing a protection circuit directly connected to each of the source/drain regions 140.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A device, comprising:
   a semiconductor substrate including a base semiconductor layer, an active semiconductor layer, and a buried insulating layer positioned between the base semiconductor layer and the active semiconductor layer;
   a set of functional gate structures comprising at least one functional gate structure formed above the active semiconductor layer;
   a first source/drain region positioned in the active semiconductor layer adjacent a first functional gate structure in the set;
   a first auxiliary gate structure positioned adjacent the first source/drain region;
   a discharge device coupled to the base semiconductor layer and the first auxiliary gate structure; and
   a first isolation structure positioned adjacent a first end of the active semiconductor layer, wherein the first auxiliary gate structure overlaps a portion of the first isolation structure.

2. The device of claim 1, further comprising:
   a second source/drain region positioned in the active semiconductor layer adjacent a second functional gate structure in the set; and
   a second auxiliary gate structure positioned adjacent the second source/drain region, wherein the discharge device is connected to the second auxiliary gate structure.

3. The device of claim 2, further comprising a second isolation structure positioned adjacent a second end of the active semiconductor layer, wherein the second auxiliary gate structure overlaps a portion of the second isolation structure.

4. The device of claim 1, wherein the set of functional gate structures further comprises a plurality of functional gate structures including a first subset of functional gate structures and a second subset of functional gate structures, wherein the first auxiliary gate structure is positioned above the active semiconductor layer between the first and second subsets and the first source/drain region is positioned adjacent a first functional gate structure in the first sub set.

5. The device of claim 4, further comprising a second source/drain region positioned in the active semiconductor layer adjacent a first functional gate structure in the second subset, wherein the first auxiliary gate structure is positioned between the first and second source/drain regions.

6. The device of claim 4, further comprising:
   a first isolation structure positioned adjacent a first end of the active semiconductor layer;
   a second source/drain region positioned in the active semiconductor layer adjacent a second functional gate structure in the first subset; and
   a second auxiliary gate structure positioned adjacent the second source/drain region and overlapping a portion of the first isolation structure, wherein the discharge device is connected to the second auxiliary gate structure.

7. The device of claim 6, further comprising:
   a second isolation structure positioned adjacent a second end of the active semiconductor layer;
   a third source/drain region positioned in the active semiconductor layer adjacent a second functional gate structure in the second subset; and
   a third auxiliary gate structure positioned adjacent the third source/drain region and overlapping a portion of the second isolation structure, wherein the discharge device is connected to the third auxiliary gate structure.

8. The device of claim 4, wherein the first subset of functional gate structures are elements of a first set of transistors with a first operating characteristic, and the second subset of functional gate structures are elements of a second set of transistors with a second operating characteristic different than the first operating characteristic.

9. The device of claim 8, wherein the first operating characteristic comprises a first threshold voltage, and the second operating characteristic comprises a second threshold voltage.

10. The device of claim 1, further comprising:
a dielectric layer formed above the set of functional gate structures, the first auxiliary gate structure, and the discharge device; and
an interconnect structure at least partially embedded in the dielectric later, wherein the interconnect structure comprises a first conductive via connected to the discharge device, a second conductive via connected to the first auxiliary gate structure, and a conductive line connected to the first and second conductive vias.

11. The device of claim 1, wherein the discharge device comprises a doped region positioned in the base semiconductor layer.

12. The device of claim 11, wherein the discharge device comprises a diode, the doped region has a first conductivity type, and the base semiconductor layer has a second conductivity type different than the first conductivity type.

13. The device of claim 11, wherein the discharge device comprises a substrate contact, and the doped region and the base semiconductor layer have a first conductivity type.

14. The device of claim 1, further comprising a plurality of fins defined in the active semiconductor layer, wherein the first source/drain region is positioned in a first fin in the plurality of fins.

15. The device of claim 14, further comprising:
a second source/drain region positioned in the first fin adjacent a second functional gate structure in the set;
a first isolation structure positioned adjacent a first end surface of the first fin;
a second isolation structure positioned adjacent a second end surface of the first fin; and
a second auxiliary gate structure positioned adjacent the second source/drain region, wherein the discharge device is connected to the second auxiliary gate structure, the first auxiliary gate structure overlaps the first end surface of the first fin and a portion of the first isolation structure, and the second auxiliary gate structure overlaps the second end surface of the first fin and a portion of the second isolation structure.

16. A device, comprising:
a semiconductor substrate including a base semiconductor layer, an active semiconductor layer, and a buried insulating layer positioned between the base semiconductor layer and the active semiconductor layer;
a plurality of functional gate structures formed above the active semiconductor layer;
a first source/drain region positioned adjacent a first functional gate structure in a first subset of the plurality of functional gate structures;
a second source/drain region positioned adjacent a first functional gate structure in a second subset of the plurality of functional gate structures;

a first auxiliary gate structure positioned between the first and second source/drain regions;
a discharge device coupled to the base semiconductor layer and the first auxiliary gate structure;
a first isolation structure positioned adjacent a first end of the active semiconductor layer proximate the first subset;
a second auxiliary gate structure overlapping a portion of the first isolation structure;
a second isolation structure positioned adjacent a second end of the active semiconductor layer proximate the second subset; and
a third auxiliary gate structure overlapping a portion of the second isolation structure, wherein the discharge device is connected to the second and third auxiliary gate structures.

17. The device of claim 16, wherein the first subset of functional gate structures are elements of a first set of transistors with a first operating characteristic, and the second subset of functional gate structures are elements of a second set of transistors with a second operating characteristic different than the first operating characteristic.

18. The device of claim 16, wherein the discharge device comprises a diode comprising a doped region positioned in the base semiconductor layer, the doped region has a first conductivity type, and the base semiconductor layer has a second conductivity type different than the first conductivity type.

19. A device, comprising:
a semiconductor substrate including a base semiconductor layer, an active semiconductor layer, and a buried insulating layer positioned between the base semiconductor layer and the active semiconductor layer;
a set of functional gate structures comprising at least one functional gate structure formed above the active semiconductor layer;
a first source/drain region positioned in the active semiconductor layer adjacent a first functional gate structure in the set;
a first auxiliary gate structure positioned adjacent the first source/drain region;
a discharge device coupled to the base semiconductor layer and the first auxiliary gate structure;
a dielectric layer formed above the set of functional gate structures, the first auxiliary gate structure, and the discharge device; and
an interconnect structure at least partially embedded in the dielectric later, wherein the interconnect structure comprises a first conductive via connected to the discharge device, a second conductive via connected to the first auxiliary gate structure, and a conductive line connected to the first and second conductive vias.

20. The device of claim 19, wherein the set of functional gate structures further comprises a plurality of functional gate structures including a first subset of functional gate structures and a second subset of functional gate structures, wherein the first auxiliary gate structure is positioned above the active semiconductor layer between the first and second subsets and the first source/drain region is positioned adjacent a first functional gate structure in the first subset.

* * * * *